US010794771B2

(12) United States Patent
Congreve et al.

(10) Patent No.: US 10,794,771 B2
(45) Date of Patent: Oct. 6, 2020

(54) COMPOSITIONS AND METHODS FOR THE DOWNCONVERSION OF LIGHT

(71) Applicant: Massachusetts Institute of Technology, Cambridge, MA (US)

(72) Inventors: Daniel N. Congreve, Cambridge, MA (US); Nicholas John Thompson, Hamilton, NJ (US); Mark W. B. Wilson, Somerville, MA (US); Mengfei Wu, Cambridge, MA (US); Marc A. Baldo, Lexington, MA (US); Moungi G. Bawendi, Cambridge, MA (US); Vladimir Bulovic, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 456 days.

(21) Appl. No.: 15/045,011

(22) Filed: Feb. 16, 2016

(65) Prior Publication Data
US 2016/0238455 A1    Aug. 18, 2016

Related U.S. Application Data

(60) Provisional application No. 62/117,012, filed on Feb. 17, 2015.

(51) Int. Cl.
*G01J 9/00* (2006.01)
*H01L 51/50* (2006.01)
*C09K 11/66* (2006.01)

(52) U.S. Cl.
CPC ............... *G01J 9/00* (2013.01); *C09K 11/661* (2013.01); *H01L 51/5012* (2013.01); *H01L 51/5016* (2013.01); *H01L 51/5028* (2013.01); *H01L 2251/5369* (2013.01)

(58) Field of Classification Search
USPC ............... 252/500, 301.16; 136/258, 252, 136/260–265; 257/40
See application file for complete search history.

(56) References Cited

U.S. PATENT DOCUMENTS

| 8,724,214 | B2 | 5/2014 | Schut et al. |
| 9,944,847 | B2 | 4/2018 | Baldo et al. |
| 2004/0118448 | A1 | 6/2004 | Scher et al. |
| 2006/0249202 | A1 | 11/2006 | Yoo et al. |
| 2007/0132052 | A1 | 6/2007 | Sargent et al. |
| 2008/0066802 | A1* | 3/2008 | Reddy ............ B82Y 10/00 136/258 |
| 2009/0044864 | A1 | 2/2009 | Thompson et al. |
| 2009/0078312 | A1 | 3/2009 | Konemann et al. |
| 2009/0290211 | A1 | 11/2009 | Miteva et al. |
| 2009/0301565 | A1 | 12/2009 | Curran et al. |
| 2009/0314341 | A1 | 12/2009 | Borden et al. |
| 2010/0014799 | A1 | 1/2010 | Bulovic et al. |
| 2011/0095277 | A1 | 4/2011 | Beierlein |
| 2011/0127445 | A1 | 6/2011 | Zhang et al. |
| 2011/0180127 | A1 | 7/2011 | Wan et al. |
| 2011/0197966 | A1 | 8/2011 | Nojima et al. |
| 2011/0253197 | A1 | 10/2011 | Mapel et al. |
| 2011/0315201 | A1 | 12/2011 | Lin et al. |
| 2013/0146854 | A1* | 6/2013 | Dong ............... H01L 51/5024 257/40 |
| 2013/0324909 | A1 | 12/2013 | Aydt et al. |
| 2014/0046083 | A1 | 2/2014 | Tilyou et al. |
| 2014/0049155 | A1 | 2/2014 | Kurtin |
| 2014/0061486 | A1 | 3/2014 | Bao et al. |
| 2014/0091278 | A1 | 4/2014 | Sykora et al. |
| 2014/0224329 | A1 | 8/2014 | Congreve et al. |
| 2016/0237343 | A1 | 8/2016 | Baldo et al. |

FOREIGN PATENT DOCUMENTS

| WO | WO 2006/034268 A2 | 3/2006 |
| WO | WO 2009/023667 A1 | 2/2009 |
| WO | WO 2014/089179 A2 | 6/2014 |

OTHER PUBLICATIONS

International Preliminary Report on Patentability dated Aug. 31, 2017 for Application No. PCT/US2016/018004.
Invitation to Pay Additional Fees dated Feb. 18, 2014 for Application No. PCT/US2013/073068.
International Search Report and Written Opinion dated Aug. 25, 2014 for Application No. PCT/US2013/073068.
International Preliminary Report on Patentability dated Jun. 18, 2015 for Application No. PCT/US2013/073068.
Invitation to Pay Additional Fees dated Mar. 25, 2016 for Application No. PCT/US2016/018017.
International Search Report and Written Opinion dated Jun. 10, 2016 for Application No. PCT/US2016/018017.
Brown et al., Energy level modification in lead sulfide quantum dot thin films through ligand exchange. ACS Nano. Jun. 24, 2014;8(6):5863-72. doi: 10.1021/nn500897c. Epub Jun. 3, 2014.
Chu et al., Efficient photovoltaic energy conversion in tetracene-C60 based heterojunctions. Applied Physics Letters. Jun. 2005;86(24):243506-1-243506-3.

(Continued)

*Primary Examiner* — Monique R Peets
(74) *Attorney, Agent, or Firm* — Wolf, Greenfield & Sacks, P.C.

(57) ABSTRACT

The present invention generally relates to composition and methods for downconverting light. In some embodiments, the composition and methods comprise an organic material, a nanocrystal, and a ligand capable of facilitating energy transfer between the organic material and the nanocrystal. In certain embodiments, the nanocrystal has a first excited energy state with an energy less than a triplet energy state of the organic material. The organic material, in some embodiments, may be aromatic and/or include one or more pi-conjugated carbon-carbon double bonds. In some cases, incident light may be absorbed by the organic material to produce two triplet excitons. The triplet excitons may then transfer to the nanocrystal via the ligand, where they can undergo recombination, resulting in the formation low energy photons.

17 Claims, 12 Drawing Sheets

(56) References Cited

OTHER PUBLICATIONS

Congreve et al., External quantum efficiency above 100% in a singlet-exciton-fission-based organic photovoltaic cell. Science. Apr. 19, 2013;340(6130):334-7. doi: 10.1126/science.1232994.

Johnson, Hybrid Solar Cells Promise More Than 95% Efficiency. EE Times. Oct. 13, 2014; 5 pages, Retrieved from http://www.eetimes.com/document.asp?doc_id=1324264& on Jun. 2, 2016.

Lee et al., Public Oral Disclosure at Peaceful Valley Ranch and Conference Center, Lyons, CO; Jun. 17, 2012,40 pages.

Paci et al., Singlet fission for dye-sensitized solar cells: can a suitable sensitizer be found? J Am Chem Soc. Dec. 27, 2006;128(51):16546-53.

Peng et al., Formation of high-quality CdTe, CdSe, and CdS nanocrystals using CdO as precursor. J Am Chem Soc. Jan. 10, 2001; 123(1):183-4.

Smith et al., Recent advances in singlet fission. Annu Rev Phys Chem. 2013;64:361-86. doi: 10.1146/annurev-physchem-040412-110130. Epub Jan. 7, 2013.

Smith et al., Singlet fission. Chem Rev. Nov. 10, 2010;110(11):6891-936. doi: 10.1021/cr1002613. Epub Nov. 1, 2010.

Thompson et al., Energy harvesting of non-emissive triplet excitons in tetracene by emissive PbS nanocrystals. Nat Mater. Nov. 2014;13(11):1039-43. doi: 10.1038/nmat4097. Epub Oct. 5, 2014.

Wu et al., Solid-state infrared-to-visible upconversion sensitized by colloidal nanocrystals. Nature Photonics. 2015;10:31-4. doi: 10/1038/NPHOTON.2015.2.26. Epub Nov. 23, 2015.

Office Action in U.S. Appl. No. 14/096,657, dated Feb. 3, 2016.

Office Action in U.S. Appl. No. 14/096,657, dated Jul. 12, 2016.

PCT/US2016/018004, Apr. 22, 2106, International Search Report and Written Opinion.

U.S. Appl. No. 14/096,657, filed Dec. 4, 2013, Congreve et al.

U.S. Appl. No. 15/045,028, filed Feb. 16, 2016, Baldo et al.

PCT/US2013/073068, Feb. 18, 2014, Invitation to Pay Additional Fees.

PCT/US2013/073068, Aug. 25, 2014, International Search Report and Written Opinion.

PCT/US2013/073068, Jun. 18, 2015, International Preliminary Report on Patentability.

PCT/US/2016/018017, Mar. 25, 2016, Invitation to Pay Additional Fees.

PCT/US/2016/018017, Jun. 10, 2016, International Search Report and Written Opinion.

Office Communication dated Feb. 3, 2016 for U.S. Appl. 14/096,657.

Office Communication dated Feb. 12, 2016 for U.S. Appl. 14/096,657.

International Preliminary Report on Patentability dated Aug. 31, 2017 for Application No. PCT/US2016/018017.

Office Action dated May 19, 2017 for U.S. Appl. No. 14/096,657.

Office Action dated Dec. 8, 2017 for U.S. Appl. No. 14/096,657.

Notice of Allowance dated Dec. 7, 2017 for U.S. Appl. No. 15/045,028.

Bi et al., A dynamic mode decomposition based edge detection method for art images. IEEE Photonics J. Dec. 2017;9(6):7303813. 13 pages.

Maestre et al., IR image upconversion under dual-wavelength laser illumination. IEEE Photonics J. Dec. 2016;8(6):6901308. 9 pages.

Office Action for U.S. Appl. No. 14/096,657 dated Apr. 20, 2018.

International Search Report and Written Opinion for Application No. PCT/US2016/018004 dated Apr. 22, 2016.

\* cited by examiner

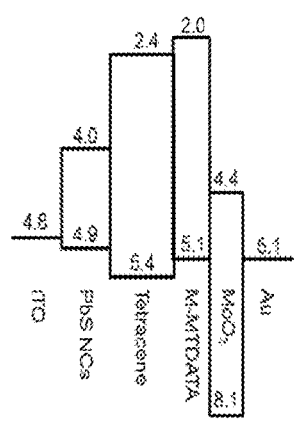 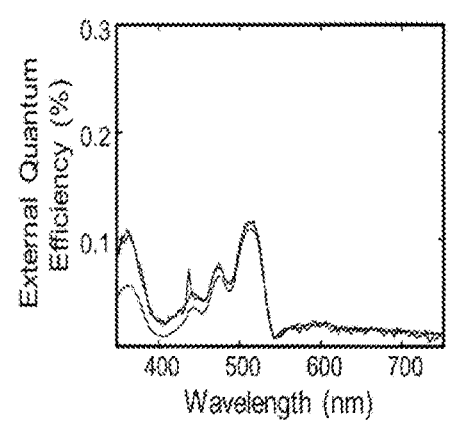 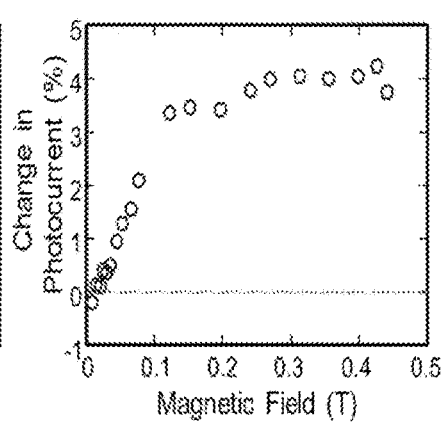
FIG. 3A                  FIG. 3B                  FIG. 3C

COMPOSITIONS AND METHODS FOR THE DOWNCONVERSION OF LIGHT

RELATED APPLICATIONS

This application claims priority under 35 U.S.C. §119(e) to U.S. Provisional Application Ser. No. 62/117,012, filed Feb. 17, 2015, which is incorporated herein by reference in its entirety for all purposes.

GOVERNMENT FUNDING

This invention was made with Government support under Grant No. DE-SC0001088 awarded by the Department of Energy. The Government has certain rights in the invention.

FIELD

The present invention generally relates to compositions and methods for downconverting light.

BACKGROUND

Downconversion is generally the process of taking one high energy photon and converting it to two or more low energy photons. Certain materials can spontaneously turn one absorbed photon which creates a singlet exciton into two triplet excitons. Triplet excitons are generally ubiquitous in organic optoelectronics, but they are often an undesirable energy sink because they are spin-forbidden from emitting light, and their high binding energy hinders the generation of free electron-hole pairs. Harvesting the energy of triplet excitons is consequently an important technological challenge, since energy-conserving photon downconversion, such as by multiple exciton generation in colloidal nanocrystals, non-linear optical processes, or simple Auger-type ionization in semiconductors, has not been previously demonstrated to be efficient at generating emitted photons, particularly, in the case of non-linear techniques, at low photon densities/field strengths. Accordingly, improved articles and methods for harvesting the energy of triplet excitons are needed.

SUMMARY OF THE INVENTION

The present invention provides compositions and methods for downconverting light.

In one aspect, methods of downconverting light are provided. In some embodiments, the method comprises applying light having a first average wavelength to an organic material associated with a nanocrystal and a ligand, the organic material comprising a heteroacene, a perylene, a phthalocyanine, an oligothiophene, a furane, an anthracene, a rubrene, or a pentacene, and the nanocrystal comprising a group III-V compound, a group II-VI compound, or a group IV element, the ligand being an organic compound having a linear carbon chain length between 5 carbon atoms and 20 carbon atoms, and determining light emitted from the nanocrystal at a second average wavelength, wherein the second average wavelength is greater than the first average wavelength.

In another aspect, articles are provided. In some embodiments, the article comprises an organic material associated with a nanocrystal and a ligand, the organic material comprising a heteroacene, a perylene, a phthalocyanine, an oligothiophene, a furane, an anthracene, a rubrene, or a pentacene, the nanocrystal comprising a group III-V compound, a group II-VI compound, or a group IV element, the ligand being an organic compound having a linear carbon chain length between 5 carbon atoms and 20 carbon atoms.

In some embodiments, the article comprises an organic material associated with a nanocrystal and a ligand, the organic material comprising a heteroacene, a perylene, a phthalocyanine, an oligothiophene, a furane, an anthracene, a rubrene, or a pentacene, the nanocrystal having a first excited energy state with an energy less than a triplet energy state of the organic material, the ligand having a length of no more than 3 nm.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

FIGS. 3A-3C are plots of (FIG. 3A) the energy levels, (FIG. 3B) external quantum efficiency, and (FIG. 3C) magnetic field effect on photocurrent of an article, according to one set of embodiments;

Figure 1A:
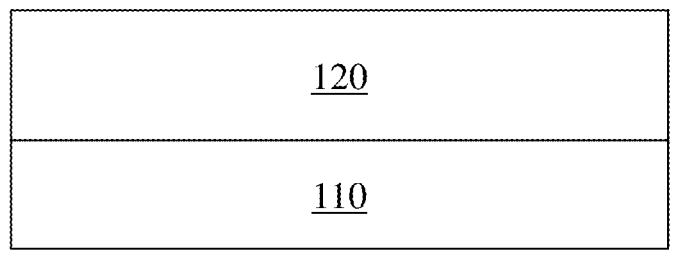
FIG. 1A is a schematic of an article comprising an organic material and a plurality of nanocrystals, according to one set of embodiments.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The present invention generally relates to composition and methods for downconverting light. In some embodiments, the composition and methods comprise an organic material, a nanocrystal, and a ligand capable of facilitating energy transfer between the organic material and the nanocrystal. In certain embodiments, the nanocrystal has a first excited energy state with an energy less than a triplet energy state of the organic material. The organic material, in some embodiments, may be aromatic and/or include one or more pi-conjugated carbon-carbon double bonds. In some cases, incident light may be absorbed by the organic material to produce two triplet excitons. The triplet excitons may then transfer to the nanocrystal via the ligand, where they can undergo recombination, resulting in the formation low energy photons.

For instance, some embodiments herein relate to articles and methods containing materials for downconverting electromagnetic radiation (e.g., light). Downconverting generally refers to the process of converting one high energy photon into two or more low energy photons (e.g., in contrast to upconversion, which generally refers to a process of converting two or more low energy photons to one higher energy photon).

In some embodiments, the articles and methods described herein may absorb photonic energy (e.g., electromagnetic energy). In certain embodiments, the article comprises an organic material, a nanocrystal, and a ligand. Incident light may be absorbed by the organic material to produce two triplet excitons. The triplet excitons may then transfer to the nanocrystal through the ligand, where they can undergo recombination, resulting in the formation low energy photons.

The organic material, in some embodiments, may be aromatic and/or include pi-conjugated carbon-carbon double bonds that can absorb incident photons. For example, the organic material may be a tetracene, or other organic materials such as those described herein. In certain embodiments, the organic material has a first excited energy state less than the triplet energy of the nanocrystal, such that triplet excitons generated (e.g., by singlet fission) by the organic material are transferred to the nanocrystal.

The nanocrystal, in some embodiments, may be a nanocrystal having a band gap, which can facilitate the recombination of the triplet excitons to produce low energy photons that can be emitted from the nanocrystal. One non-limiting example is PbS; other nanocrystals are discussed in more detail below. The photons may be transferred from the organic material to the nanocrystal via a ligand.

The ligand, when present, may be capable of facilitating energy transfer between the organic material and the nanocrystal (e.g., the ligand adds solubility and/or passivates the nanocrystal). The ligand may comprise, for example, an alkyl chain (e.g., containing $(CH_2)_n$ or other moieties) through which the photons can be transmitted from the organic material to the nanocrystal. For example, the ligand may be positioned as a layer or a film between the nanocrystals and the organic material (e.g., the ligand bound to the nanocrystal). This and other arrangements are discussed in more detail below.

Such articles may be useful in numerous applications including, but not limited to, photovoltaics and lighting. For example, some embodiments as described herein may be incorporated into photovoltaic devices to allow for increased photocurrent (e.g., from the blue end of the solar spectrum), resulting in increased efficiency of the photovoltaic device. In some embodiments, the incorporation of articles described herein into lighting sources (e.g., fluorescent lighting) may, for example, significantly increase the efficiency of the lighting source (e.g., by generating two red photons from each single UV photon). Devices and methods described herein may also be useful in applications such as imaging technology, light detection, and military applications, etc.

As mentioned, in some embodiments, the article includes an organic material associated with a nanocrystal and, optionally, a ligand. In certain embodiments, the organic material may associate with the nanocrystal and/or the optional ligand via formation of a bond, such as an ionic bond, a covalent bond, a hydrogen bond, a dative bond, Van der Waals interactions, and the like. In some cases, at least a portion of the organic material, such as substantially an entire surface of the organic material, may be associated with a nanocrystal and/or a ligand. The covalent bond may be, for example, carbon-carbon, carbon-oxygen, oxygen-silicon, sulfur-sulfur, phosphorus-nitrogen, carbon-nitrogen, metal-oxygen, or other covalent bonds. The hydrogen bond may be, for example, between hydroxyl, amine, carboxyl, thiol, and/or similar functional groups. The dative bond may be, for example, complexation or chelation between metal ions and monodentate or multidentate ligands.

As illustrated in FIG. 1A, in some embodiments, article 100 comprises nanocrystal layer 110 comprising the nanocrystal is deposited on at least a portion of a surface of organic material 120 (e.g., a layer of nanocrystals deposited on the organic material in the form of a thin film). The article may be arranged, for example, such that the organic material is positioned in direct physical contact with nanocrystals, as is shown here, and/or such that the organic material and the nanocrystals are separated by a layer of ligand material in direct physical contact with both the organic material and the nanocrystals.

Figure 1B:
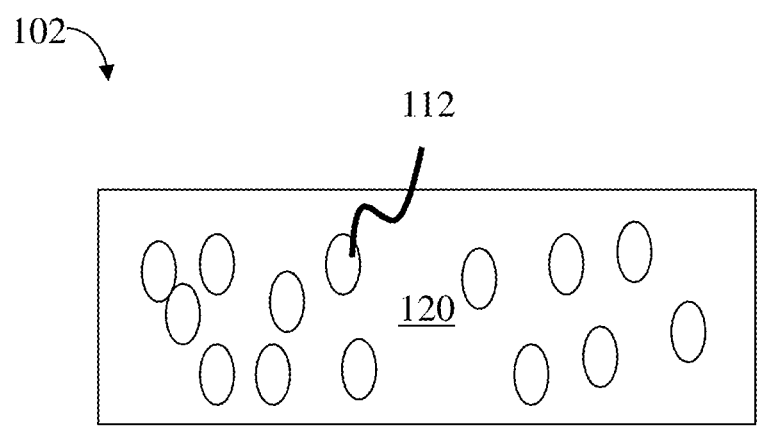
FIG. 1B is a schematic of an article comprising an organic material and a plurality of nanocrystals, according to one set of embodiments.

For example, in certain embodiments, as illustrated in FIG. 1B, article 102 comprises nanocrystals 112 embedded within organic material 120 (e.g., a plurality of nanocrystals embedded within a thin film of the organic material). In other embodiments, other arrangements of organic material, nanocrystal, and ligand are also possible, e.g., as discussed herein.

The organic material may comprise any material capable of performing singlet fission. That is to say, the organic material, in some embodiments, may spontaneously turn one absorbed photon which creates a singlet exciton into two triplet excitons. Without wishing to be bound by theory, each of the two triplet excitons generated by the organic material generally have about half the initial photon energy of the absorbed photon. The organic material and nanocrystals may be selected and arranged such that, in operation, the organic material absorbs energy (e.g., light) to produce singlet excitons, which then undergo singlet fission to produce two triplet excitons per singlet exciton. The term singlet is known in the art and generally refers to an energy state in which an electron is excited from the ground state (e.g., where electron spins are paired) to a first higher energy level (e.g., in the molecular electronic state) where the electron has the same spin orientation as it had in the ground state. The term triplet is also known in the art and generally refers to a refers to an energy state in which an electron is excited from the ground state to a higher energy state having the same spin orientation as the other unpaired electron.

Figure 2A:
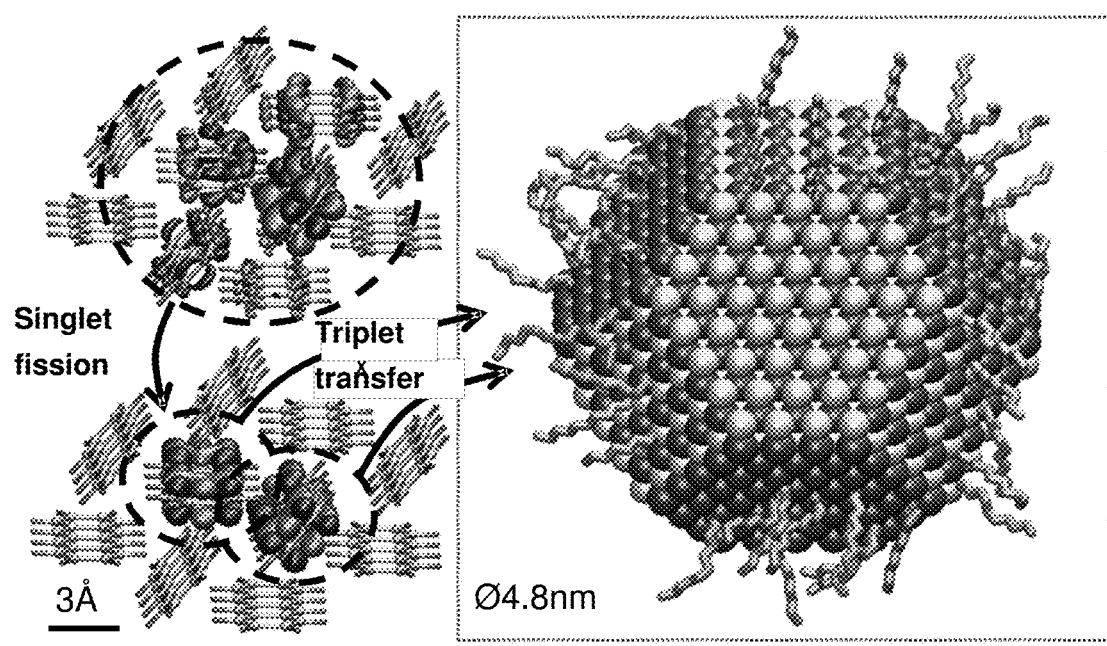
FIG. 2A is a schematic of a triplet exciton transfer from an organic material to a nanocrystal, according to one set of embodiments.

In some such embodiments, the triplet excitons are transferred to the nanocrystals where they can undergo recombination resulting in the formation of a photon (e.g., two photons for each photon initially absorbed by the organic material) (e.g., due to spin mixing). For example, FIG. 2A illustrates one embodiment where triplet excitons are generated after singlet fission and transferred from the organic material to a nanocrystal (e.g., a nanocrystal and associated ligands).

In some embodiments, the device includes an organic material, wherein light absorbed by the organic material is transferred to the nanocrystal layer directly beneath the organic material, which allows for the direct transfer of triplet excitons from the organic material to the nanocrystals. In addition, in some embodiments, the devices includes an organic material, wherein light absorbed by the organic material is transferred to the nanocrystals embedded within the organic material, which allows for the direct transfer of triplet excitons from the organic material to the nanocrystals. See, e.g., FIGS. 1A and 1B. The transfer may occur, for example, via a Dexter-type transfer, e.g., as discussed herein. It should also be understood that any of the organic materials described herein may be useful as exciton donor materials and/or electron donor materials.

The organic material may include any species capable of absorbing photonic energy and forming an excited state, such as a singlet excited state. In some cases, the organic material is an exciton donor material. In some cases, the organic material is an electron donor material. In some cases, the organic material includes an organic species, including organic compounds and polymers. In some cases, the organic material includes an organometallic species or an organic species associated with a metal (e.g., forming a complex). In some cases, the organic material is capable of functioning as a singlet fission material. Those of ordinary skill in the art would be capable of selecting appropriate organic materials that exhibit singlet fission properties. For example, the organic material may be selected to have a sufficiently high singlet energy and/or triplet energy, or a particular ratio of singlet energy to triplet energy such that singlet fission may occur. In some cases, the organic material may include an organic compound selected to have a singlet energy that is about two times greater than its triplet energy. In some cases, the organic compound may have a singlet energy of greater than about 2.2 eV and/or a triplet energy of greater than about 1.1 eV. In some cases, the organic compound may have a singlet energy of about 2.2 eV and a triplet energy of about 1.1 eV.

In some embodiments, the organic material is a solid single fission material. Some non-limiting examples of singlet fission materials include heteroacenes, polyacenes (e.g., pentacene), oligophenyls, tetracyano-p-quinodimethane, 1,3-diphenylisobenzofuran, perylene, phthalocyanine, oligothiophene furane, anthracene, tris-(8-hydroxyquinoline)aluminum, benzophenone, rubrene, carotenoids, conjugated polymers (e.g., polydiacetylenes, poly(diethyl dipropargylmalonate), poly(p-phenylene)s, poly(p-phenylene vinylene)s, poly(arylene)s such as polythiophene, etc.), polyacenes, o-quinodimethanes, and the like.

In one set of embodiments, the organic material is an optionally substituted polyacene species or an optionally substituted polyene species. The optionally substituted polyacene species may be a polycyclic aromatic hydrocarbon that includes a network of fused benzene rings having the following formula,

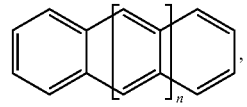

where n is 0, 1, 2, 3, 4, 5, 6, 7, 8, 9, 10, or greater than 10. In some cases, the polyacene species may be substituted with one or more additional functional groups. In some embodiments, the optionally substituted polyacene species may be an optionally substituted oligoacene species. In some embodiments, the optionally substituted polyacene species may be an optionally substituted naphthalene, an optionally substituted anthracene, an optionally substituted tetracene, an optionally substituted pentacene, or an optionally substituted hexacene. It should be understood that an optionally substituted polyacene containing any number of fused benzene rings may be suitable for use in embodiments described herein. Those of ordinary skill in the art would be able to select a polyacene species containing a desired number of fused benzene rings and/or the appropriate number and types of functional groups on the polyacene species in order to suit a particular application. In some cases, the optionally substituted polyacene species is an optionally substituted tetracene or an optionally substituted pentacene. Examples of such species include tetracene, rubrene, dithienyl tetracene, TIPS-tetracene, dibithienyl tetracene, diphenyl tetracene, terbutyl rubrene, pentacene, TIPS-pentacene, diphenyl pentacene, dibiphenyl pentacene, dithienyl pentacene, or dibithienyl pentacene.

The optionally substituted polyene species may be any species that contains two, three, four, or more pi-conjugated carbon-carbon double bonds. For example, the optionally substituted polyene species may contain a series of alternating carbon-carbon double bonds and carbon-carbon single bonds. In some embodiments, the optionally substituted polyene species may be an optionally substituted oligoene species. In some cases, the optionally substituted polyene species may be a diene, triene, tetraene, or another species containing a greater number of pi-conjugated carbon-carbon double bonds. In some cases, the polyene species may be substituted with one or more additional functional groups. It should be understood that an optionally substituted polyene containing any number of pi-conjugated carbon-carbon double bonds may be suitable for use in embodiments described herein. Those of ordinary skill in the art would be able to select a polyene species containing a desired number of pi-conjugated carbon-carbon double bonds and/or the appropriate number and types of functional groups on the polyene species in order to suit a particular application. In some embodiments, the optionally substituted polyene species is diphenylbutadiene, diphenylhexatriene, or diphenyloctatetraene. In some cases, the optionally substituted polyacene may include a heteroatom (e.g., oxygen, nitrogen, sulfur, phosphorus, etc.) For example, the optionally substituted polyacene may be diphenyl isobenzofuran, or the like.

In one set of embodiments, the organic material includes tetracene. However, in another set of embodiments, the organic material does not include tetracene.

As mentioned, the organic material may be associated with a nanocrystal, e.g., directly, or via a ligand. For instance, the organic material may be positioned next to the nanocrystals, and/or separated by a ligand. Generally, the nanocrystals associated with the organic material have a first excited energy state with an energy less than or about equal to a triplet energy state of the organic material. In some embodiments, the first excited energy state is about half that of the triplet energy state of the organic material.

In some embodiments, the nanocrystal may be a nanoparticle, such as a semiconductor nanoparticle or quantum dot. However, it should be understood that other types of nanocrystals besides quantum dots are also possible in other embodiments. In some cases, the nanocrystal is a quantum dot containing one or more metals. In some embodiments, the nanocrystal comprises a group III-V compound. In certain embodiments, the nanocrystal comprises a group II-VI compound. In some cases, the nanocrystal may comprise a group IV element. Non-limiting examples of nanocrystals (e.g., quantum dots) include Lead Sulfide (PbS), Lead Selenide (PbSe), Cadmium Sulfide (CdS), Cadmium Selenide (CdSe), Cadmium Telluride (CdTe), Cadmium Arsenide (CdAs), Indium Arsenide (InAs), Indium Phosphide (InP), Indium Antimonide (InSb), Zinc Sulfide (ZnS), Zinc Selenide (ZnSe), Zinc Telluride (ZnTe), Gallium Arsenide (GaAs), Gallium Phosphide (GaP), Gallium Antimonide (GaSb), Mercury Sulfide (HgS), Mercury Selenide (HgSe), Mercury Telluride (HgTe), Aluminum Arsenide (AlAs), Aluminum Phosphide (AlP), Aluminum Antimonide (AlSb). Many such nanocrystals are readily commercially available.

It should also be understood that other nanocrystals, or alloys or mixtures of nanocrystals, are also suitable for use in embodiments described herein. The specific composition of the nanocrystals is typically selected, in part, to provide the desired optical properties within the device. For example, the nanocrystals may be selected such that is capable of undergoing FRET with one or more components of the device, such as the organic material (e.g., singlet fission material). In some embodiments, the nanocrystal includes a composition that is not PbS. It is also possible for composites of the invention to nanocrystals having different compositions.

In some embodiments, the nanocrystal is a colloidal nanocrystal. In some such embodiments, the nanocrystal may comprise a homogeneous core comprising a nanocrystal material as described above and an inorganic shell. In some embodiments, the inorganic shell comprises a nanocrystal material as described above (e.g., PbS, PbSe, CdS, CdSe, CdTe, CdAs, InAs, InP, InSb, ZnS, ZnSe, ZnTe, GaAs, GaP, GaSb, HgS, HgSe, HgTe, AlAs, AlP, AlSb, etc.). For example, in some embodiments, the inorganic shell comprises a group III-V compound (IUPAC Groups 13-15), a group II-VI compound (IUPAC Group 12-16), or a group IV element (IUPAC Group 14). In some embodiments, the inorganic shell material is different than the homogeneous core material.

The nanocrystals (e.g., quantum dots) generally have particle sizes of less than 1000 nanometers. For example, the average size of the nanocrystals may be less than about 1000 nm, less than about 800 nm, less than about 500 nm, less than about 300 nm, less than about 100 nm, less than about 80 nm, less than about 50 nm, less than about 30 nm, less than about 20 nm, less than about 10 nm, or less than about 5 nm. Thus, as examples, the average particle size of the nanocrystals may be less than 20 nanometers, or the average particle size is less than 5 nanometers (e.g., about 3.5 nanometers). In some embodiments, the average particle size of the nanocrystals is greater than about 0.5 nm or greater than about 1 nm. Combinations of any of these are also possible, e.g., the nanocrystals may have an average particle size of between about 1 nm and about 20 nm. Average particle size of a nanocrystal may be determined, for example, using profilometry or other established techniques.

Figure 2B:
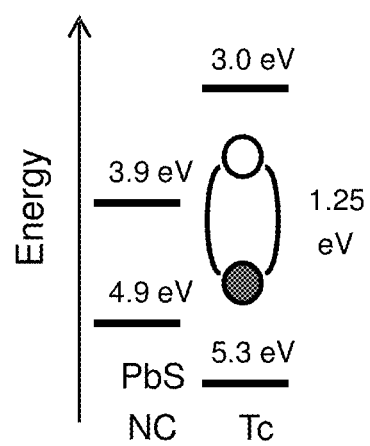
FIG. 2B is a diagram of the organic material and nanocrystal excitonic states, according to one set of embodiments.
Figure 4:
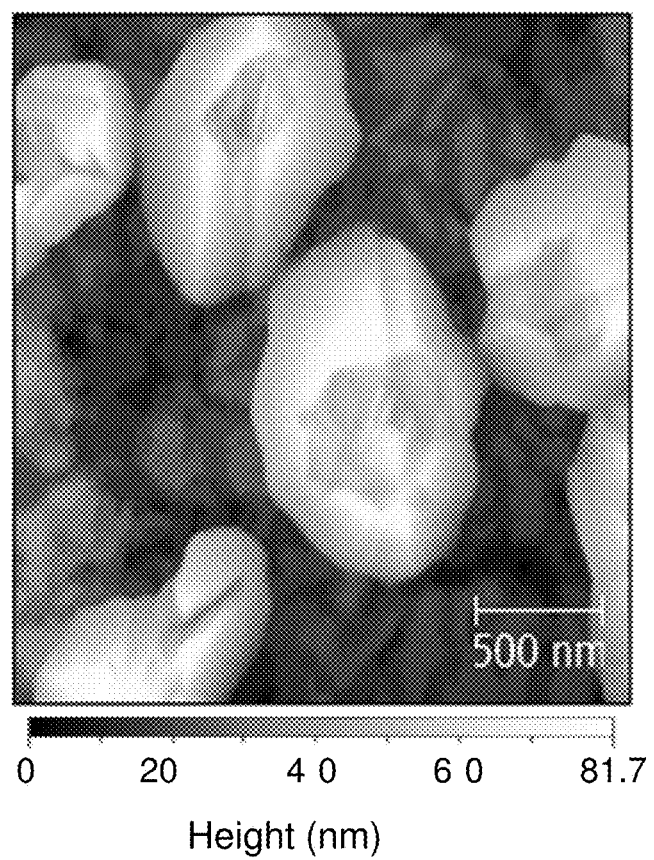
FIG. 4 is an atomic force micrograph of an organic material layer deposited on nanocrystals, according to one set of embodiments.

As discussed, the nanocrystal may be a quantum dot, or may be another suitable nanoparticle. In some embodiments, the nanocrystal may have a band gap, which can facilitate the recombination of the triplet excitons to produce low energy photons that can be emitted from the nanocrystal. The term "band gap" is known in the art and generally refers to the energy difference (e.g., in electron volts, eV) between the valence band and the conduction band of a material. In some cases, the band gap of the nanocrystal may range between about 0.5 eV and about 2.5 eV. In some embodiments, the band gap of the nanocrystal is greater than or equal to about 0.5 eV, greater than or equal to about 0.6 eV, greater than or equal to about 0.7 eV, greater than or equal to about 0.8 eV, greater than or equal to about 0.9 eV, greater than or equal to about 1.0 eV, greater than or equal to about 1.2 eV, greater than or equal to about 1.4 eV, greater than or equal to about 1.6 eV, greater than or equal to about 1.8 eV, greater than or equal to about 2.0 eV, greater than or equal to about 2.2 eV, or greater than or equal to about 2.4 eV. In certain embodiments, the band gap of the nanocrystal is less than about 2.5 eV, less than about 2.4 eV, less than about 2.2 eV, less than about 2.0 eV, less than about 1.8 eV, less than about 1.6 eV, less than about 1.4 eV, less than about 1.2 eV, less than about 1.0 eV, less than about 0.9 eV, less than about 0.8 eV, less than about 0.7 eV, or less than about 0.6 eV. Combinations of the above referenced ranges are also possible (e.g., between about 0.5 eV and about 2.5 eV). Other values are also possible. In an illustrative embodiment, the band gap of a PbS nanocrystal (PbS NC) is illustrated in FIG. 2B (e.g., the band gap of the PbS NC is about 1.0 eV, the different between the conductive band (e.g., 4.9 eV) and the valence band (e.g., 3.9 eV)).

The article may include additional components that may enhance device performance. For example, the device may include a component (e.g., a ligand) capable of facilitating energy transfer between the organic material and the nanocrystal. In some cases, the organic material, alone, may not produce an emission under the operating conditions of the device, but when arranged in combination with another component, the organic material may produce an emission. In some embodiments, the device comprises a ligand associated with the nanocrystal, e.g., with a surface of the nanocrystal. The ligand may be disposed, in some cases, between the nanocrystal and the organic material (e.g., on the surface of the nanocrystal and in direct contact with the organic material). In some embodiments, the ligand comprises an inorganic material. In certain embodiments, the ligand comprises an organic material.

Those skilled in the art will be able to select suitable ligands for use in the embodiments described herein, based upon the teachings of this specification. For example, in some embodiments, the ligand comprises a saturated or unsaturated, branched or unbranched polymer comprising a terminal carboxylic acid, amine, thiol, and/or pyridine. In certain embodiments, the ligand further comprises a halide, an oxide, or a hydroxide ion. Non-limiting examples of suitable ligands include oleic acid, capric acid, octanoic acid, or the like. For example, in some embodiments, the ligand comprises the structure $CH_3(CH_2)_n COOH$ where n is 3-18 (e.g., n may be 3, 4, 5, 6, 7, 8, 9, 10, 11, 12, 13, 14, 15, 16, 17, and/or 18). In certain embodiments, the ligand comprises the structure $(CH_3)(CH_2)_pCH=CH(CH_2)_q$ COOH, wherein p and q are the same or different and each may independently be between 1-18 (e.g., 1, 2, 3, 4, 5, 6, 7, 8, 9, 10, 11, 12, 13, 14, 15, 16, 17, and/or 18). In some embodiments, the ligand comprises a thiol (e.g., benzenethiols such as 1,2-, 1,3-, and 1,4-benzenedithiol, 1,2-ethanedithiol (EDT), 3-mercaptopropionic acid (MPA)), a primary amine (e.g., 1,2-ethylenediamine (EDA)), ammonium thiocyanate (SCN), and/or a halide (e.g., tetrabutylammonium iodide (TBAI), tetrabutylammonium bromide (TB ABr), tetrabutylammonium chloride (TBACl), tetrabutylammonium fluoride (TBAF). In some embodiments, ligands, such as those described above (e.g., comprising the structure $CH_3(CH_2)_nCOOH$ or comprising the structure $(CH_3)(CH_2)_pCH=CH(CH_2)_qCOOH)$, may be selected to have a particular length. For example, in some embodiments, the length of the ligand may be less than or equal to about 3 nm (e.g., less than or equal to about 2.5 nm, less than or equal to about 2 nm, less than or equal to about 1.5 nm, less than or equal to about 1.0 nm, or less than or equal to about 0.5 nm). In some embodiments, the ligand comprises an organic compound having a linear carbon chain length between 5 carbon atoms and 20 carbon atoms. For example, in some embodiments, the ligand may be at least 5 carbon atoms in length, at least 6 carbon atoms in length, at least 7 carbon atoms in length, at least 8 carbon atoms in length, at least 9 carbon atoms in length, at least 10 carbon atoms in length, at least 12 carbon atoms in length, at least 14 carbon atoms in length, at least 16 carbon atoms in length, or at least 18 carbon atoms in length. In certain embodiments, the ligand is less than 20 carbon atoms in length, less than 18 carbon atoms in length, less than 16 carbon atoms in length, less than 14 carbon atoms in length, less than 12 carbon atoms in length, less than 10 carbon atoms in length, less than 9 carbon atoms in length, less than 8 carbon atoms in length, less than 7 carbon atoms in length, or less than 6 carbon atoms in length. Combinations of the above-referenced ranges are also possible (e.g., between 5 carbon atoms and 20 carbon atoms in length, between 7 carbon atoms and 16 carbon atoms in length).

In some embodiments, as described above, the transfer of triplet excitons from the organic material to the nanocrystal may occur at a high efficiency. For example, in some embodiments, the energy transfer efficiency may be greater than or equal to about 20%, greater than or equal to about 40%, greater than or equal to about 50%, greater than or equal to about 75%, or greater than or equal to about 90%. In certain embodiments, the presence of an additional component (e.g., a ligand) may alter the efficiency of triply exciton transfer from the organic material to the nanocrystal, as compared to articles that do not include an additional component. Methods for determining transfer efficiency are known in the art and may include, for example, transient photoluminescence spectroscopy.

The components of the article may arranged in various configurations. In some cases, the organic material, the nanocrystals, and, optionally, a ligand, may be formed as layers or films. In some embodiments, the nanocrystal and/or the ligand may be dispersed in clusters throughout the organic material. In some embodiments, the organic material and/or the ligand may be dispersed in clusters throughout the nanocrystals (e.g., a nanocrystal layer). In some cases, the components may be randomly dispersed with respect to one another, thereby forming a heterogeneous material. In some cases, an array of different articles with different compositions and different morphologies or different layouts can be used.

For example, in some embodiments, components of articles described herein may be provided in the form of films or layers, such as a thin film. For example, one or more of the organic material, nanocrystal, optional ligands, or other components, may be provided in the form of thin films or layers such that a multilayer stack is formed. In some cases, the thickness of the film may be between about 1 nm and about 1 micrometer, or between about 1 nm and about 500 nm, or between about 1 nm and about 500 nm, or between about 1 nm and about 250 nm, or between about 1 nm and about 100 nm. In some cases, the film may have an average thickness of less than about 1000 nm, less than about 750 nm, less than about 500 nm, less than about 250 nm, less than about 100 nm, and/or the film may have an average thickness of at least about 1 nm, at least about 10 nm, at least about 100 nm, at least about 250 nm, at least about 500 nm, at least about 750 nm, etc., and/or combinations thereof (e.g., the film may be between about 1 nm and about 1,000 nm). If more than one film is present (e.g., a film of organic material, a film of nanocrystals, a film of ligand, etc.), the films may each independently be the same or different sizes.

Film thicknesses may be measured using techniques such as profilometry. In some embodiments, it may be desirable to provide the organic material as a relatively thin film. In some cases, the thickness of the organic material may be from about 1 nm to about 250 nm, from about 1 nm to about 50 nm, or from about 1 nm to about 25 nm (e.g., 15 nm), or other thicknesses such as those described above. It should be understood that in some embodiments, a relatively greater thickness may be desired (e.g., greater than 100 nm).

Those of ordinary skill in the art will be aware of methods for forming films or layers of various components, including solution coating, ink jet printing, spin coating, dip coating, spray coating, evaporation techniques such as chemical vapor deposition and the like. In some embodiments, a solution may be provided comprising the organic material, the nanocrystal, and/or an optional ligand in a solvent (e.g., tetrahydrofuran, toluene, benzene, diethyl ether, hexanes, dimethylsulfoxide, etc.). One or more, or all of the components to be incorporated in the film may be soluble or substantially soluble in the solvent. The solution may be placed on, or in contact with, a substrate or other component of the device, and the solvent may be evaporated, thereby forming a film. In some cases, a mixture of the organic material, the nanocrystal, and/or an optional ligand may be directly evaporated onto a surface (e.g., in the absence of a solvent).

In other cases, one material may be dispersed within another material in the form of clusters, e.g., as is shown in FIG. 1B. For instance, nanocrystals may be evenly dispersed in a layer or film of organic material, or vice versa. The nanoscrystals may be homogenously dispersed, or dispersed in clusters, e.g., having an average diameter of less than about 1000 nm, less than about 750 nm, less than about 500 nm, less than about 250 nm, less than about 100 nm, or the like.

Articles described herein (e.g., comprising an organic material, a nanocrystal, and, optionally, a ligand) may be exposed to electromagnetic radiation using methods known to those of ordinary skill in the art. In some embodiments, electromagnetic radiation is applied to the article to increase the wavelength and/or the intensity of the electromagnetic radiation. In some embodiments, the articles described herein absorb (e.g., the organic material absorbs) electromagnetic radiation (e.g., light) at a first wavelength and emits (e.g., emitted by the nanocrystal) electromagnetic radiation at a second wavelength greater than the first wavelength (i.e. downconversion of the electromagnetic radiation).

The wavelength emitted refers to the wavelength at which the peak maximum of the emission occurs in an emission spectrum. The emission may be a particular peak having the largest intensity in an emission spectrum (e.g. a fluorescence spectrum), or, alternatively, the emission may be a peak in an emission spectrum that has at least a defined maximum, but has a smaller intensity relative to other peaks in the emission spectrum. Methods for determining wavelength emission are known in the art and may include, for example, photoluminescence excitation spectroscopy.

In some embodiments, a change in luminescence intensity may occur for an emission with substantially no shift in the wavelength of the luminescence (e.g., emission), wherein the intensity of the emission changes but the wavelength remains essentially unchanged. In other embodiments, the change in luminescence intensity may occur for an emission in combination with a shift in the wavelength of the luminescence (e.g., emission). For example, an emission may simultaneously undergo a shift in wavelength in addition to an increase or decrease in luminescence intensity.

In some embodiments, the average wavelength of light absorbed by the composition is between about 400 nm and about 1600 nm. For example, in some embodiments, the average wavelength of light absorbed by the composition may be greater than or equal to about 400 nm, greater than or equal to about 500 nm, greater than or equal to about 600 nm, greater than or equal to about 700 nm, greater than or equal to about 800 nm, greater than or equal to about 900 nm, greater than or equal to about 1000 nm, greater than or equal to about 1100 nm, greater than or equal to about 1200 nm, greater than or equal to about 1300 nm, greater than or equal to about 1400 nm, or greater than or equal to about 1500 nm. In certain embodiments, the average wavelength of light absorbed by the composition may be less than about 1600 nm, less than about 1500 nm, less than about 1400 nm, less than about 1300 nm, less than about 1200 nm, less than about 1100 nm, less than about 1000 nm, less than about 900 nm, less than about 800 nm, less than about 700 nm, less than about 600 nm, or less than about 500 nm. Combinations of the above-referenced ranges are also possible (e.g., an average wavelength between about 400 nm and about 1600 nm)

In certain embodiments, the percent difference between the average wavelength absorbed by the composition and the average wavelength emitted by the composition is at least about 10%. For example, in some embodiments, the percent difference between the average wavelength absorbed by the composition and the average wavelength emitted by the composition is at least about 10%, at least about 20%, at least about 50%, at least about 70%, or at least about 90%, relative to average wavelength emitted.

As used herein, the term "substituted" is contemplated to include all permissible substituents of organic compounds, "permissible" being in the context of the chemical rules of valence known to those of ordinary skill in the art. It will be understood that "substituted" also includes that the substitution results in a stable compound, e.g., which does not spontaneously undergo transformation such as by rearrangement, cyclization, elimination, etc. In some cases, "substituted" may generally refer to replacement of a hydrogen with a substituent as described herein. However, "substituted," as used herein, does not encompass replacement and/or alteration of a key functional group by which a molecule is identified, e.g., such that the "substituted" functional group becomes, through substitution, a different functional group. For example, a "substituted phenyl group" must still comprise the phenyl moiety and cannot be modified by substitution, in this definition, to become, e.g., a pyridine ring. In a broad aspect, the permissible substituents include acyclic and cyclic, branched and unbranched, carbocyclic and heterocyclic, aromatic and nonaromatic substituents of organic compounds. Illustrative substituents include, for example, those described herein. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms.

Examples of substituents include, but are not limited to, aliphatic, alicyclic, heteroaliphatic, heteroalicyclic, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, heteroalkylthio, heteroarylthio, sulfonyl, sulfonamido, ketone, aldehyde, ester, heterocyclyl, aromatic or heteroaromatic moieties, —$CF_3$, —CN, aryl, aryloxy, perhaloalkoxy, aralkoxy, heteroaryl, heteroaryloxy, heteroarylalkyl, heteroaralkoxy, azido, amino, halide, alkylthio, oxo, acylalkyl, carboxy esters, -carboxamido, acyloxy, aminoalkyl, alkylaminoaryl, alkylaryl, alkylaminoalkyl, alkoxyaryl, arylamino, aralkylamino, alkylsulfonyl, -carboxamidoalkylaryl, -carboxamidoaryl, hydroxyalkyl, haloalkyl, alkylaminoalkylcarboxy-, aminocarboxamidoalkyl-, cyano, alkoxyalkyl, perhaloalkyl, arylalkyloxyalkyl, (e.g., $SO_4(R')_2$), a phosphate (e.g., $PO_4(R')_3$), a silane (e.g., $Si(R')_4$), a urethane (e.g., R'O(CO)NHR'), and the like. Additionally, the substituents may be selected from F, Cl, Br, I, —OH, —$NO_2$, —CN, —NCO, —$CF_3$, —$CH_2CF_3$, —$CHCl_2$, —$CH_2OR_x$, —$CH_2CH_2OR_x$, —$CH_2N(R_x)_2$, —$CH_2SO_2CH_3$, —$C(O)R_x$, —$OC_2(R_x)$, —$CON(R_x)_2$, —$OC(O)R_x$, —$C(O)OC(O)R_x$, —$OCO_2R_x$, —$OCON(R_x)_2$, —$N(R_x)_2$, —$S(O)_2R_x$, —$OCO_2R_x$, —$NR_x(CO)R_x$, —$NR_x(CO)N(R_x)_2$, wherein each occurrence of $R_x$ independently includes, but is not limited to, H, aliphatic, alicyclic, heteroaliphatic, heteroalicyclic, aryl, heteroaryl, alkylaryl, or alkylheteroaryl, wherein any of the aliphatic, alicyclic, heteroaliphatic, heteroalicyclic, alkylaryl, or alkylheteroaryl substituents described above and herein may be substituted or unsubstituted, branched or unbranched, cyclic or acyclic, and wherein any of the aryl or heteroaryl substituents described above and herein may be substituted or unsubstituted.

In general, the term "aliphatic," as used herein, includes both saturated and unsaturated, straight chain (i.e., unbranched) or branched aliphatic hydrocarbons, which are optionally substituted with one or more functional groups, as defined below. As will be appreciated by one of ordinary skill in the art, "aliphatic" is intended herein to include, but is not limited to, alkyl, alkenyl, alkynyl moieties. Illustrative aliphatic groups thus include, but are not limited to, for example, methyl, ethyl, n-propyl, isopropyl, allyl, n-butyl, sec-butyl, isobutyl, tert-butyl, n-pentyl, sec-pentyl, isopentyl, tert-pentyl, n-hexyl, sec-hexyl, moieties and the like, which again, may bear one or more substituents, as previously defined.

As used herein, the term "alkyl" is given its ordinary meaning in the art and may include saturated aliphatic groups, including straight-chain alkyl groups, branched-chain alkyl groups, cycloalkyl (alicyclic) groups, alkyl substituted cycloalkyl groups, and cycloalkyl substituted alkyl groups. An analogous convention applies to other generic terms such as "alkenyl," "alkynyl," and the like. Furthermore, as used herein, the terms "alkyl," "alkenyl," "alkynyl," and the like encompass both substituted and unsubstituted groups.

In some embodiments, a straight chain or branched chain alkyl may have 30 or fewer carbon atoms in its backbone, and, in some cases, 20 or fewer. In some embodiments, a straight chain or branched chain alkyl has 12 or fewer carbon atoms in its backbone (e.g., $C_1$-$C_{12}$ for straight chain, $C_3$-$C_{12}$ for branched chain), has 6 or fewer, or has 4 or fewer. Likewise, cycloalkyls have from 3-10 carbon atoms in their ring structure or from 5, 6 or 7 carbons in the ring structure. Examples of alkyl groups include, but are not limited to, methyl, ethyl, propyl, isopropyl, cyclopropyl, butyl, isobutyl, tert-butyl, cyclobutyl, hexyl, cyclochexyl, and the like. In some cases, the alkyl group might not be cyclic. Examples of non-cyclic alkyl include, but are not limited to, methyl, ethyl, propyl, isopropyl, n-butyl, tert-butyl, n-pentyl, neopentyl, n-hexyl, n-heptyl, n-octyl, n-decyl, n-undecyl, and dodecyl.

The terms "alkenyl" and "alkynyl" refer to unsaturated aliphatic groups analogous in length and possible substitution to the alkyls described above, but that contain at least one double or triple bond respectively. Alkenyl groups include, but are not limited to, for example, ethenyl, propenyl, butenyl, 1-methyl-2-buten-1-yl, and the like. Non-limiting examples of alkynyl groups include ethynyl, 2-propynyl (propargyl), 1-propynyl, and the like.

The terms "heteroalkenyl" and "heteroalkynyl" refer to unsaturated aliphatic groups analogous in length and possible substitution to the heteroalkyls described above, but that contain at least one double or triple bond respectively.

As used herein, the term "halogen" or "halide" designates —F, —Cl, —Br, or —I.

The term "aryl" refers to aromatic carbocyclic groups, optionally substituted, having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl). That is, at least one ring may have a conjugated Pi electron system, while other, adjoining rings can be cycloalkyls, cycloalkenyls, cycloalkynyls, aryls, and/or heterocycyls. The aryl group may be optionally substituted, as described herein. "Carbocyclic aryl groups" refer to aryl groups wherein the ring atoms on the aromatic ring are carbon atoms. Carbocyclic aryl groups include monocyclic carbocyclic aryl groups and polycyclic or fused compounds (e.g., two or more adjacent ring atoms are common to two adjoining rings) such as naphthyl group. Non-limiting examples of aryl groups include phenyl, naphthyl, tetrahydronaphthyl, indanyl, indenyl and the like.

The terms "heteroaryl" refers to aryl groups comprising at least one heteroatom as a ring atom, such as a heterocycle. Non-limiting examples of heteroaryl groups include pyridyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, and the like.

It will also be appreciated that aryl and heteroaryl moieties, as defined herein, may be attached via an aliphatic, alicyclic, heteroaliphatic, heteroalicyclic, alkyl or heteroalkyl moiety and thus also include -(aliphatic)aryl, -(heteroaliphatic)aryl, -(aliphatic)heteroaryl, -(heteroaliphatic)heteroaryl, -(alkyl)aryl, -(heteroalkyl)aryl, -(heteroalkyl) aryl, and -(heteroalkyl)-heteroaryl moieties. Thus, as used herein, the phrases "aryl or heteroaryl" and "aryl, heteroaryl, (aliphatic)aryl, -(heteroaliphatic)aryl, -(aliphatic)heteroaryl, -(heteroaliphatic)heteroaryl, -(alkyl)aryl, -(heteroalkyl)aryl, -(heteroalkyl)aryl, and -(heteroalkyl)heteroaryl" are interchangeable.

The term "arylalkyl," as used herein, refers to a group comprising an aryl group attached to the parent molecular moiety through an alkyl group.

The term "arylheteroalkyl," as used herein, refers to a group comprising an aryl group attached to the parent molecular moiety through a heteroalkyl group.

The term "heteroarylalkyl," as used herein, refers to a group comprising a heteroaryl group attached to the parent molecular moiety through an alkyl group.

Int. Pat. Apl. Pub. No. WO 2014/089179, published Jun. 12, 2014, entitled "Devices Including Organic Materials Such as Singlet Fission Materials," is incorporated herein by reference in its entirely. In addition, U.S. Pat. Apl. No. 62/117,000, filed on Feb. 17, 2015, entitled "Methods and Compositions for the Upconversion of Light," is also incorporated herein by reference in its entirely. Also incorporated herein by reference is U.S. Provisional Application Ser. No. 62/117,012, filed Feb. 17, 2015.

Having thus described several aspects of some embodiments of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

EXAMPLES

The following examples are intended to illustrate certain embodiments of the present invention, but do not exemplify the full scope of the invention.

Example 1

The following example describes the synthesis of nanocrystals, according to some embodiments.

Lead sulfide nanocrystals (NC) were synthesized as described below. Specifically, lead (II) acetate trihydrate (11.38 g, 30 mmol), 1-octadecene and oleic acid (varied quantities as designated by Table 1) were degassed in a 1000 ml three-neck round-bottom flask at 100° C. until the solution turned clear. The solution was cannula transferred to a nitrogen-flushed 1000 mL four-neck round-bottom flask equipped with a mechanical stirrer. Under nitrogen flow, the solution was heated to the injection temperature (see below), at which point a mixture of bis(trimethylsilyl)sulfide (3.15 ml, 15 mmol) in 1-octadecene (150 ml) was rapidly injected. The resulting nanocrystals were transferred to a nitrogen glovebox where flocculation was performed three times with anhydrous butanol, methanol, and/or acetone. The nanocrystals were redispersed in hexanes or octane.

TABLE 1

| First absorption feature (nm) | Quantity in reaction pot (ml) | | Injection temp (° C.) | Growth time (s) | Flocculation solvent |
|---|---|---|---|---|---|
| | 1-octadecene | oleic acid | | | |
| 931 | 300 | 21 | 120 | 0 | acetone |
| 1010 | 263 | 37 | 150 | 30 | butanol and methanol |

TABLE 1-continued

| First absorption feature (nm) | Quantity in reaction pot (ml) | | Injection temp (° C.) | Growth time (s) | Flocculation solvent |
|---|---|---|---|---|---|
| | 1-octadecene | oleic acid | | | |
| 1135 | 225 | 75 | 150 | 60 | butanol and methanol |
| 1308 | 150 | 150 | 150 | 30 | butanol |

Example 2

The following example describes the fabrication of organic materials and nanocrystals, according to some embodiments.

The glass substrate was cleaned by sequential sonication in Micro90 detergent solution, deionized water, and acetone, after which it was immersed in boiling isopropanol and then dried under a stream of pure $N_2$. The nanocrystals and substrates were loaded into a dry nitrogen glovebox with $H_2O$ and $O_2$ concentrations less than 1 ppm. Solutions of oleic acid (OA) capped nanocrystals dissolved at 25 mg/mL in octane were spin-cast onto the cleaned soda lime glass at a speed of 2500 rpm and a ramp rate of 2000 rpm/s for a total of 60 seconds. For ligand exchanged samples, the single layer of nanocrystals was exposed to a 0.01 M solution of ligand in acetonitrile. The exposure time varied between 30 seconds to 30 minutes. After exposure, the excess ligand was removed by three rinse cycles with pure acetonitrile. The resulting nanocrystal layer is 50.0+/−5.4 nm thick.

Tetracene layers were thermally evaporated at pressures less than $3 \times 10^{-6}$ Torr at rates between 1 and 3 Å/s. The thermal evaporator was directly attached to the glovebox. The tetracene was purchased from Sigma-Aldrich and purified three times by vacuum sublimation before use. Samples were packed in the pure nitrogen glovebox using UV-curing epoxy and a second glass substrate. Care was taken to shadow the active area of the substrates with Al foil during UV exposure.

Example 3

In the following example, a photovoltaic device containing an article as described herein is investigated.

Inverted photovoltaic devices were constructed to verify the energy level-based prediction that the tetracene/PbS interface does not dissociate excitons. The energy level diagram is shown in FIG. 3. Two layers of nanocrystals were spun on the ITO and ligand exchanged to caprylic acid. These layers were followed by 20 nm of tetracene, 8 nm of m-MTDATA as an exciton blocking layer, and 5 nm $MoO_3$ to improve contact to the gold cathode (80 nm). The external quantum efficiency of these devices is plotted in FIG. 3(b). The overall EQE is low, due to the low conductivity of the nanocrystals and poor hole extraction of the device. However, the absorption peaks of tetracene are clearly visible. This indicates that photons may be absorbed in the tetracene generate photocurrent. However, UPS results, FIG. 3(a), indicate that the HOMO level of the nanocrystals is ill-suited for charge transfer state formation, as charge formation is endothermic by 0.15 eV. Thus, this photocurrent may be via triplet transfer to the nanocrystals followed by field dissociation of the exciton in the nanocrystal layer.

Further evidence of the lack of any charge transfer state formation was derived from the comparison of the magnetic field effect on fluorescence or photocurrent with and without the presence of electrical contacts. As shown in FIG. 3(c), triplet-charge annihilation (characterized in the magnetic field effect by a rapid increase in the photocurrent at low magnetic fields followed by rapid saturation) was readily apparent when the contacts are present, but no triplet-charge annihilation is found in any of the bilayer optical structures (see FIGS. 7A and 7B), indicating a lack of free charge in those films. It is expected that charge is formed within the nanocrystal layer in the presence of an electric field, which is created in the electrical device at the ITO/PbS Schottky contact and by the alignment of the anode and cathode under short circuit conditions.

Example 4

Lead (II) Sulfide (PbS) colloidal nanocrystals were employed as an inorganic semiconductor acceptor for a non-emissive triplet exciton. Synthesis of the nanocrystals is described in Example 1. Triplet excitons were generally generated in tetracene via singlet fission, which produced dark triplet excitons rapidly ($\tau<200$ ps) and at yields approaching 200% in neat films. The respective energy levels of tetracene and the nanocrystals were determined by ultraviolet photoelectron spectroscopy (UPS) and are shown in FIG. 2B. The interface between tetracene and the nanocrystals is a type I heterojunction. Further, excitonic energy transfer was energetically preferred over two consecutive charge transfers since both of the possible charge transfer intermediates were expected to have higher energies than the initial tetracene triplet energy (1.25 eV). The morphology, as determined by atomic force microscopy (AFM), of the sample is shown in FIG. 1C. It consisted of several monolayers of PbS nanocrystals that were coated with a thermally-evaporated layer of tetracene. The tetracene layer was relatively rough and consistent with Stranski-Krastanov growth of an initial inhomogeneous coating of tetracene followed by island formation.

Example 5

To demonstrate transfer of triplet excitons from tetracene to PbS nanocrystals, first, the excitation spectrum of the tetracene/PbS bilayers were measured and optical excitation of tetracene results in emission from PbS were observed. Second, the yield of excitons transferred to PbS per photon absorbed by tetracene was demonstrated. The yield exceeded one, demonstrating the involvement of triplet excitons generated by singlet exciton fission in tetracene. The efficiency of energy transfer was consistent with a Dexter mechanism and exponentially dependent on the length of the ligand spacers on the surface of the nanocrystals. The dominance of triplet, rather than singlet energy transfer was confirmed using an external magnetic field to vary the rate of singlet exciton fission. Reducing the fission rate lessened the energy transferred to the nanocrystal. The rate of triplet energy transfer was characterized using transient photoluminescence.

Figures 5A, 5B, 5C:
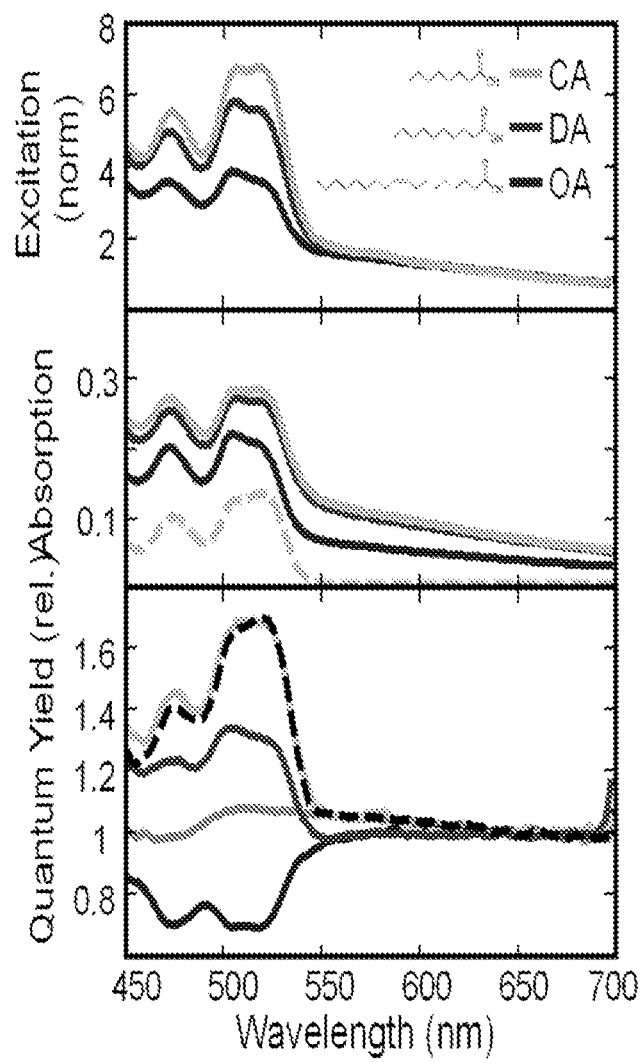
FIGS. 5A-5C are plots of (FIG. 5A) excitation, (FIG. 5B) absorption, and (FIG. 5C) relative photoluminescence quantum yield of films of organic materials and nanocrystals, according to one set of embodiments.

As noted above, energy transfer from tetracene was probed by measuring the near-infrared emission from the nanocrystals while preferentially exciting the tetracene layer. In FIG. 5, the excitation spectrum of a thin film of PbS nanocrystals coated with a 20-nm-thick film of tetracene was measured. The absorption spectra of tetracene and the nanocrystals were distinct, with PbS absorption dominant at longer wavelengths ($\lambda>550$ nm), and PbS and tetracene both absorbing at shorter wavelengths ($\lambda<550$ nm); see FIG. 5.

The absorption of tetracene was structured, with three characteristic peaks in the blue-green spectrum. Thus, the appearance of tetracene peaks in the excitation spectrum of PbS nanocrystal luminescence demonstrated energy transfer from tetracene to the nanocrystals.

The the rate of energy transfer generally increased with decreasing distance between the donor and acceptor. PbS nanocrystals were synthesized with insulating oleic acid (OA) ligands, which generally passivate surface traps and provided solubility in organic solvents.

In the solid state, however, the ligand may act as a spacer between the nanocrystals and the tetracene. Using solid-state ligand exchange, the OA ligand can be replaced with a number of shorter alkyl carboxylic acid derivatives, such as decanoic (capric) acid (DA) and caprylic (octanoic) acid (CA). As shown in FIG. 5, both ligands resulted in improved energy transfer, demonstrated by the increased excitation efficiency in the regions of tetracene absorption. Decreasing the ligand length reduced the quantum yield of the nanocrystals. The typical quantum yield of the films of OA-functionalized nanocrystals was approximately 9%, decreasing to 0.5% for the shorter CA-functionalized nanocrystals.

Correcting the excitation spectra for the absorption spectra gives the relative photoluminescence quantum yield shown in FIG. 5. The intrinsic quantum yield of emission from PbS nanocrystals may be independent of incident wavelength in the measurement range. The tetracene-coated samples, however, exhibited either dips or peaks in their blue-green spectrum depending on the ligand length. These features may have resulted from the competition between 'shadowing'—the absorption of photons in tetracene that would otherwise have been absorbed by the nanocrystals—and efficient energy transfer from tetracene to the PbS nanocrystals. The wavelength dependent quantum yield of photons from the nanocrystal can be expressed as:

$$QY(\lambda) = QY_{NC}\left(\frac{ABS_{NC}(\lambda) + \eta_{fis}\eta_{ET}ABS_{Tc}(\lambda)}{ABS_{NC}(\lambda) + ABS_{Tc}(\lambda)}\right) \quad (1)$$

where $ABS_{NC}$ is the absorption of the nanocrystal, $QY_{NC}$ is the intrinsic quantum yield of the nanocrystal, $ABS_{Tc}$ is the absorption of tetracene, $\lambda_{fis}$ is the yield of excitons in tetracene after singlet exciton fission, and $\lambda_{ET}$ is the exciton transfer efficiency from tetracene to the nanocrystal.

Analysis of the photoluminescence quantum yield demonstrated that the efficiency of energy transfer was improved when the nanocrystal ligand was short. In FIG. 5, nanocrystals treated with OA exhibit dips in the quantum yield for regions of strong tetracene absorption while CA-treated nanocrystals have peaks. Using the measured absorption spectra for neat films of tetracene and PbS nanocrystals the product $\lambda_{fis}\lambda_{ET}$ was determined by fitting. An example fit is plotted in FIG. 6, where $\lambda_{fis}\lambda_{ET}$=2.0. Averaging thirteen different samples with caprylic acid ligands, $\lambda_{fis}\lambda_{ET}$=1.80±0.26.

Figure 6:
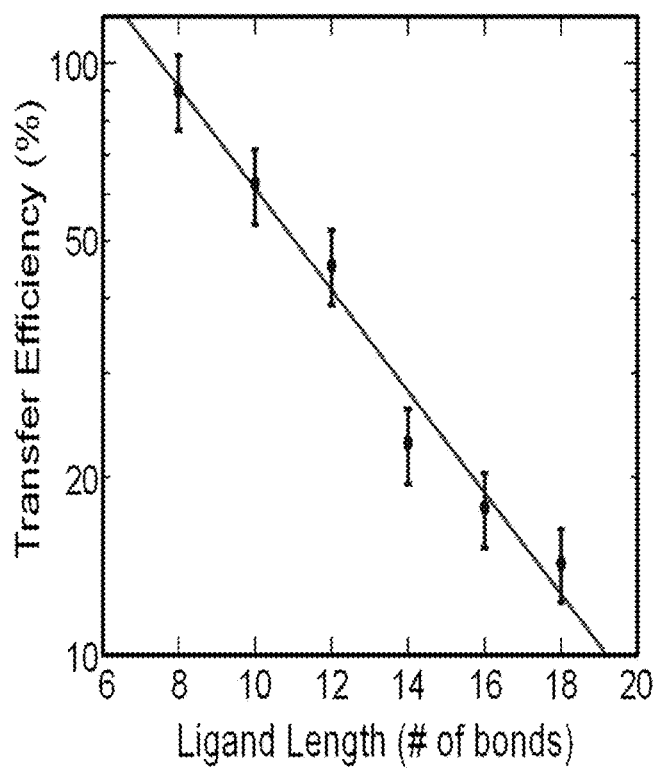
FIG. 6 is a plot of energy transfer efficiency versus ligand length, according to one set of embodiments.

The observation that $\lambda_{fis}\lambda_{ET}$>1 suggests that the direct transfer of triplet excitons was the primary method of energy transfer in the device, because the efficient transfer of triplets generated in pairs by fission could result in more excitons transferred to the nanocrystals than photons absorbed in the tetracene. Specifically, assuming $\lambda_{fis}$=2, the lower bound for the efficiency of triplet transfer to CA-treated nanocrystals was $\lambda_{ET}$=0.90±0.13. Furthermore, as shown in FIG. 6, the transfer efficiency had an exponential dependence on the number of carbon-carbon bonds in the alkyl carboxylic acid ligand, which is consistent with Dexter transfer. The fit followed exp($-2\lambda_n$n) where $\lambda_n$=0.098 (C—C bonds)$^{-1}$ and n is the number of C—C bonds. Assuming a radial ligand morphology, this extracted value of $\lambda_n$ was nearly one order of magnitude greater than typically observed in charge transfer studies.

Example 6

Figure 7A:
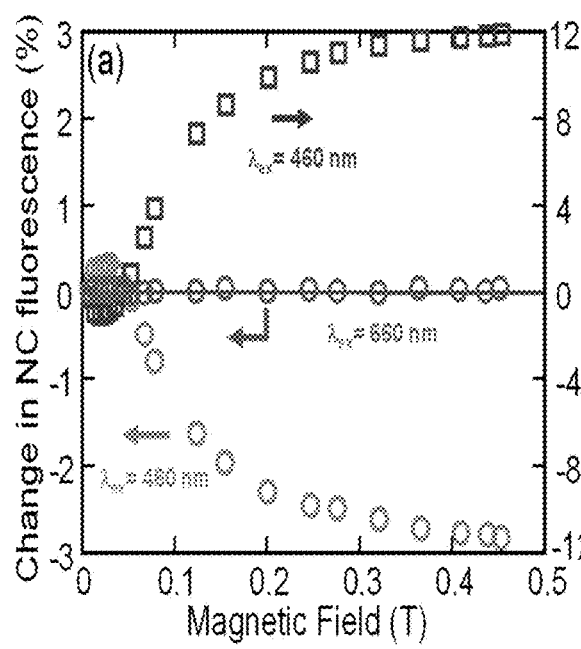
FIGS. 7A-7B are graphs of change in emission of nanocrystal thin films coated in organic material thin films in response to an applied magnetic field, according to one set of embodiments.

Triplet exciton transfer from tetracene to the PbS nanocrystals was determined and additionally distinguished from singlet exciton transfer via the steady state magnetic field dependence of singlet exciton fission. A magnetic field B>0.4 T slowed the effective rate of triplet generation, shifting the balance from triplets towards singlets. Magnetic field studies are especially useful in devices, since they can isolate the contribution of fission to the overall performance. In FIG. 7A, the steady-state change in fluorescence from the tetracene coating and fluorescence from the tetracene coated nanocrystal film as a function of magnetic field is plotted. When exciting both tetracene and the PbS nanocrystals with continuous-wave light ($\lambda$=460 nm), the magnetic field dependence of each material is characteristic of singlet exciton fission was observed, and closely matches previous photocurrent- and emission-based measurements. Further, the dependences have opposite sign, which may occur because the inhibition of fission preserves singlets, leading to additional photoluminescence from the tetracene, while decreasing the reservoir of triplets, so that the nanocrystals emit less light. The field-dependence is generally due to singlet fission—as shown in FIG. 7A, the nanocrystal fluorescence is generally unaffected by the magnetic field when the bilayer film is excited at wavelengths where tetracene does not absorb. This is consistent with theoretical predications that a B=0.5 T field is insufficient to significantly perturb the excitonic states of colloidal nanocrystals at room temperature. No significant change in linewidth or position of the emission spectrum under a B=0.5 T magnetic field was observed.

Figure 7B:
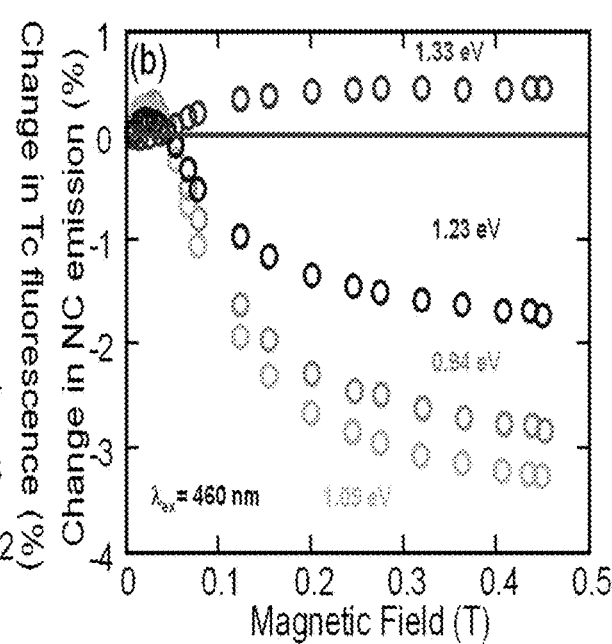

The activation energy dependence of the triplet energy transfer process is shown in FIG. 7B. Dexter energy transfer generally favors acceptor materials with excited states equal or less in energy than the excited state in the donor. In PbS nanocrystals, this energy is strongly dependent on the size of the particles due to quantum confinement. Thus, through the synthesis of different sized nanocrystals, the magnetic-field—dependence of fluorescence can be examined for nanocrystals with a range of exciton energies; see FIG. 7B. Nanocrystals with exciton energy greater than the tetracene triplet energy of 1.25 eV exhibit a positive change in fluorescence under large magnetic field, indicating energy transfer in these systems is primarily from singlet excitons. The 'threshold' transition to a negative magnetic field effect when nanocrystals' optical gap is less than 1.25 eV is difficult to reconcile with efficient singlet transfer, and instead indicates that singlet exciton fission and triplet exciton transfer overwhelms Förster transfer in this system when the transfer is exothermic.

Example 7

Figure 8A:
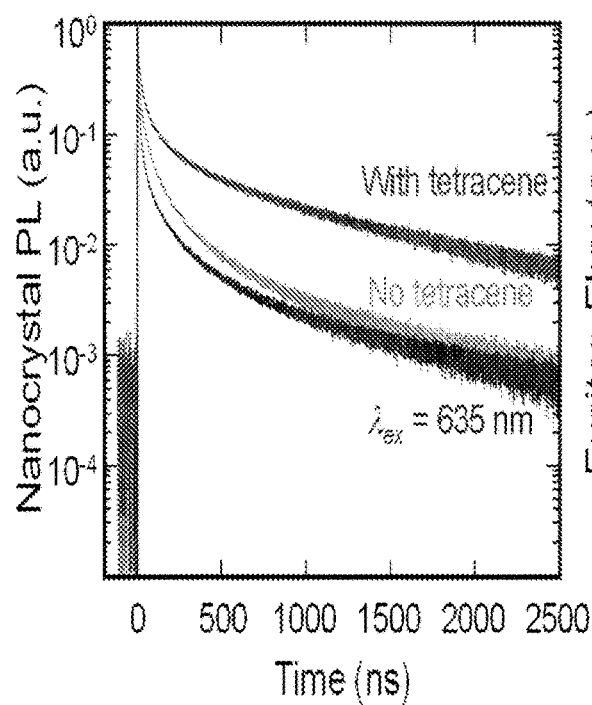
FIGS. 8A-8B are plots of fluorescence as a function of time for nanocrystal thin films coated in organic material thin films, according to one set of embodiments.
Figure 8B:
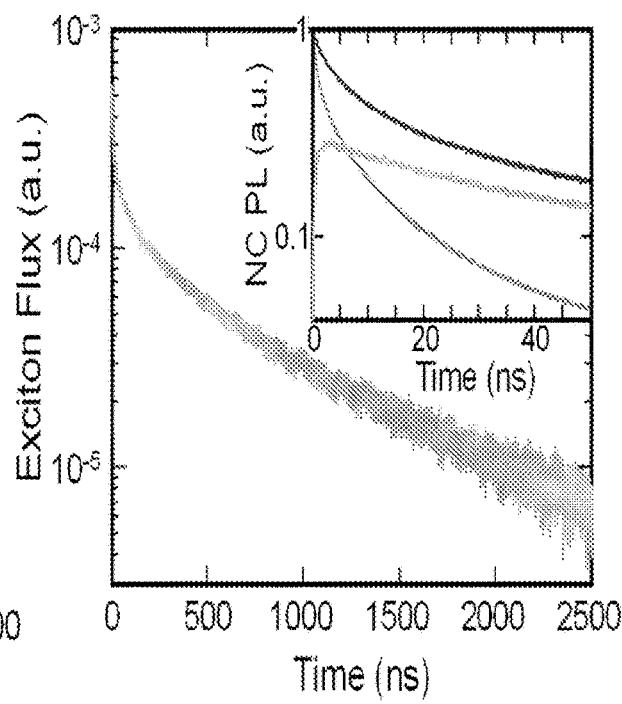

The dynamics of triplet exciton transfer are obtained using transient near-infrared photoluminescence spectroscopy. In FIG. 8(a) the photoluminescence decay of the nanocrystal layer is multi-exponential with a longest lifetime of nearly 1 μs. The intrinsic nanocrystal decay dynamics does not change significantly upon coating the nanocrystals with tetracene. However, when tetracene is optically excited, the resulting nanocrystal transient shows enhanced emission following the initial excitation. This delayed emission likely results from the influx of long-lived triplet excitons from tetracene. To obtain the time-dependent flux of excitons from the tetracene to the nanocrystal layer and distinguish between direct optical pumping of the nanocrystals and triplet transfer from tetracene, the photoluminescent impulse response of the nanocrystals was deconvolved from the total transient response. The resulting exciton flux is plotted in FIG. 8(b). It appearsdto be predominantly diffusion-limited but with a rapid initial component due to energy transfer from tetracene molecules immediately adjacent to the nanocrystals. In the inset of FIG. 8(b), the initial time constant of energy transfer to the nanocrystals is shown to be <10 ns. Transient measurements of tetracene fluorescence show little evidence of quenching by nanocrystals within the first 20 ns, confirming the absence of significant singlet exciton energy transfer. Beyond 20 ns, significant quenching of the emission from tetracene was observed only under excitation conditions which ensure a large population of free triplets that interact bimolecularly.

Example 8

Figure 9A:
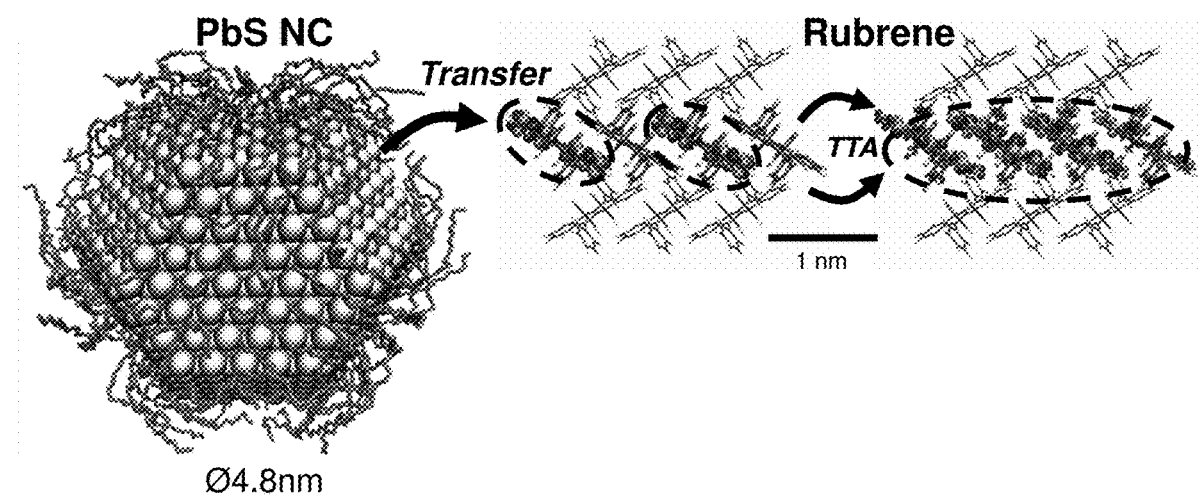
FIG. 9A is a schematic of a nanocrystal and an organic material, according to one set of embodiments.
Figure 9B:
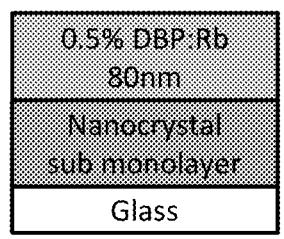
FIG. 9B is a schematic diagram of a device, according to one set of embodiments.

In the following example, a device containing an article as described herein is investigated. Devices with three sizes of lead sulphide (PbS) nanocrystals (NCs), as shown in FIG. 9A, were fabricated, all with native oleic acid ligands. The device had a structure as shown in FIG. 9C, in the form of a solid state thin film. When cast into thin films, the first excitonic absorption peaks were at $\lambda$=850, 960, and 1010 nm respectively. An 80 nm thick film of rubrene doped with 0.5 vol % dibenzotetraphenylperiflanthene (DBP) was thermally evaporated to form a host-guest annihilator-emitter layer (e.g., which may be used in organic light-emitting diodes (OLEDs)).

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When the word "about" is used herein in reference to a number, it should be understood that still another embodiment of the invention includes that number not modified by the presence of the word "about."

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method of downconverting light, the method comprising:
   applying light having a first average wavelength to an organic material associated with a nanocrystal and a ligand, the organic material comprising a heteroacene, a perylene, a phthalocyanine, an oligothiophene, a furane, an anthracene, a rubrene, or a pentacene, and the nanocrystal comprising a group III-V compound, a group II-VI compound, or a group IV element, the ligand being an unsaturated organic compound having a linear carbon chain length between 5 carbon atoms and 20 carbon atoms;
   transferring photons from the organic material to the nanocrystal; and
   determining light emitted from the nanocrystal at a second average wavelength, wherein the second average wavelength is greater than the first average wavelength.

2. The method as in claim 1, wherein the first average wavelength is between about 400 nm and about 1600 nm.

3. The method as in claim 1, wherein the organic material has a singlet energy of greater than about 2.2 eV and/or a triplet energy of greater than about 1.1 eV.

4. The method as in claim 1, wherein the ligand has a linear carbon chain length between 7 carbon atoms and 16 carbon atoms.

5. The method as in claim 1, wherein the ligand has a length of no more than 3 nm.

6. The method as in claim 1, wherein the nanocrystal is selected from the group consisting of PbS, PbSe, CdS, CdSe, CdTe, CdAs, InAs, InP, and HgTe.

7. The method as in claim 1, wherein the nanocrystal has a band gap of between about 0.5 eV and about 2.5 eV.

8. The method as in claim 1, wherein the nanocrystal comprises an inorganic shell.

9. The method of claim 8, wherein the inorganic shell comprises a group III-V compound, a group II-VI compound, or a group IV element different than the nanocrystal.

10. The method as in claim 1, wherein the organic material does not comprise tetracene.

11. The method as in claim 1, wherein the nanocrystal does not comprise PbS.

12. The method as in claim 1, wherein the organic material produces triplet excitons via singlet fission.

13. The method of claim 12, wherein the triplet excitons are transferred to the nanocrystals.

14. The method of claim 13, wherein the transfer of triplet excitons has an efficiency of at least about 75%.

15. The method as in claim 1, wherein the ligand facilitates energy transfer from the organic material to the nanocrystal.

16. The method as in claim 1, wherein photons are transferred from the organic material to the nanocrystal upon performing the step of applying light.

17. The method as in claim 1, wherein the nanocrystal is configured to facilitate the recombination of the triplet excitons to produce and emit low energy photons.

* * * * *